US012616002B2

(12) United States Patent
Nakashima et al.

(10) Patent No.: US 12,616,002 B2
(45) Date of Patent: Apr. 28, 2026

(54) WAFER HOLDING APPARATUS AND METHOD OF MANUFACTURING SEMICONDUCTOR DEVICE

(71) Applicant: RENESAS ELECTRONICS CORPORATION, Tokyo (JP)

(72) Inventors: Kazuki Nakashima, Tokyo (JP); Daishi Morisaki, Tokyo (JP); Kenichi Noguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 695 days.

(21) Appl. No.: 18/048,190

(22) Filed: Oct. 20, 2022

(65) Prior Publication Data

US 2023/0207375 A1 Jun. 29, 2023

(30) Foreign Application Priority Data

Dec. 28, 2021 (JP) ................................. 2021-214053

(51) Int. Cl.
| | |
|---|---|
| *H10P 72/78* | (2026.01) |
| *H10D 30/01* | (2025.01) |
| *H10P 72/50* | (2026.01) |

(52) U.S. Cl.
CPC ........... *H10P 72/78* (2026.01); *H10D 30/021* (2025.01); *H10P 72/53* (2026.01)

(58) Field of Classification Search
CPC ............... H01L 21/6838; H01L 21/681; H01L 21/68728; H10D 30/021; H10D 30/0227
See application file for complete search history.

(56) References Cited

U.S. PATENT DOCUMENTS

| | | | | |
|---|---|---|---|---|
| 6,669,808 B2 * | 12/2003 | Adachi | ............. | H01L 21/68728 |
| | | | | 134/33 |
| 8,057,602 B2 * | 11/2011 | Koelmel | ........... | H01L 21/68742 |
| | | | | 118/728 |
| 2002/0134512 A1 * | 9/2002 | Adachi | ............. | H01L 21/68728 |
| | | | | 156/345.17 |

(Continued)

FOREIGN PATENT DOCUMENTS

| | | | | | |
|---|---|---|---|---|---|
| CN | 102376532 A | * | 3/2012 | ....... | H01L 21/68792 |
| CN | 109478524 A | * | 3/2019 | ....... | H01L 21/68792 |

(Continued)

OTHER PUBLICATIONS

Office Action dated Mar. 18, 2025, issued in corresponding Japanese Patent Application No. 2021-214053, 21 pages.

*Primary Examiner* — Mohammed Shamsuzzaman
(74) *Attorney, Agent, or Firm* — Rimon P.C.

(57) ABSTRACT

A semiconductor wafer held by a Bernoulli chuck is reliably rotated. A wafer holding apparatus includes: a chuck for holding a semiconductor wafer; and a rotating mechanism for rotating the chuck. On a facing surface of the chuck facing the semiconductor wafer, a plurality of pads and a plurality of support parts are formed. The chuck holds the semiconductor wafer by jetting gas from each of the plurality of pads. The plurality of support parts is formed at positions each deviated from a center of the facing surface of the chuck. When the chuck holds the semiconductor wafer, the plurality of pads is not in contact with the semiconductor wafer while the plurality of support parts is in contact with a principal surface of the semiconductor wafer.

12 Claims, 12 Drawing Sheets

(56)     References Cited

U.S. PATENT DOCUMENTS

| | | | |
|---|---|---|---|
| 2003/0002973 A1* | 1/2003 | Kostler | G03F 7/707 |
| | | | 414/754 |
| 2009/0087932 A1 | 4/2009 | Kondoh | |
| 2016/0079108 A1* | 3/2016 | Kobayashi | H01L 21/6875 |
| | | | 118/729 |
| 2016/0237565 A1* | 8/2016 | Sieber | C23C 16/45508 |
| 2018/0040502 A1* | 2/2018 | Kon | H01L 21/67115 |
| 2018/0308741 A1* | 10/2018 | Breingan | H01L 21/6838 |
| 2020/0141003 A1* | 5/2020 | Lee | H01L 21/6838 |
| 2021/0090927 A1* | 3/2021 | Takayama | H01L 21/67766 |
| 2021/0305065 A1* | 9/2021 | Kakinuma | H01L 21/677 |
| 2021/0358796 A1* | 11/2021 | Kakinuma | H01L 21/6838 |

FOREIGN PATENT DOCUMENTS

| | | | | |
|---|---|---|---|---|
| CN | 111063647 A | * | 4/2020 | F17D 3/01 |
| CN | 112542399 A | * | 3/2021 | H01L 21/67288 |
| CN | 112542417 A | * | 3/2021 | H01L 21/683 |
| CN | 114639630 A | * | 6/2022 | H01L 21/68721 |
| EP | 0999575 A2 | * | 5/2000 | H01L 21/67092 |
| EP | 1369904 A2 | * | 12/2003 | H01L 21/6704 |
| JP | 2004361178 A | * | 12/2004 | H01L 21/67271 |
| JP | 2009088222 A | * | 4/2009 | H01L 21/67196 |
| JP | 2012195346 A | * | 10/2012 | H01L 21/6838 |
| JP | 2015099814 A | * | 5/2015 | H01L 21/67288 |
| JP | 2017069264 A | * | 4/2017 | H01L 21/68721 |
| JP | 6219692 B2 | * | 10/2017 | H01L 21/68721 |
| JP | 2018041968 A | * | 3/2018 | H01L 21/67288 |
| JP | 2019021725 A | * | 2/2019 | H01L 21/67259 |
| JP | 2021048359 A | * | 3/2021 | H01L 21/6838 |
| JP | 2021180244 A | * | 11/2021 | H01L 21/67766 |
| KR | 100924930 B1 | * | 11/2009 | H01L 21/67028 |
| KR | 101476061 B1 | * | 12/2014 | H01L 21/6838 |
| KR | 102384032 B1 | * | 4/2022 | H01L 21/67271 |
| KR | 20230117238 A | * | 8/2023 | H01L 21/6838 |
| TW | 201545264 A | * | 12/2015 | H01L 21/68792 |
| TW | 1723240 B | * | 4/2021 | H01L 21/6838 |
| WO | WO-2008041625 A1 | * | 4/2008 | G11B 5/84 |
| WO | WO-2014082196 A1 | * | 6/2014 | H01L 21/6838 |
| WO | WO-2017071831 A1 | * | 5/2017 | C23C 14/352 |
| WO | WO-2023174750 A1 | * | 9/2023 | H01L 21/67115 |

* cited by examiner

HOLDING OF SEMICONDUCTOR WAFER 5 ON CHUCK 2 — S1

DETECTION OF NOTCH 31 OF SEMICONDUCTOR WAFER 5 — S2

ROTATION OF SEMICONDUCTOR WAFER 5 BY PREDETERMINED ANGLE — S3

CORRECTION OF HORIZONTAL POSITION OF SEMICONDUCTOR WAFER 5 — S4

READING OF INFORMATION 32 — S5

SB(5)

ST        SB        ST

ST          SB          GF          PW          ST

SW          GE          SW

ST          SD          EX          GF          EX     PW     SD          ST
           SB

WAFER HOLDING APPARATUS AND METHOD OF MANUFACTURING SEMICONDUCTOR DEVICE

CROSS-REFERENCE TO RELATED APPLICATION

The disclosure of Japanese Patent Application No. 2021-214053 filed on Dec. 28, 2021, including the specification, drawings and abstract is incorporated herein by reference in its entirety.

BACKGROUND

The present invention relates to a wafer holding apparatus and a method of manufacturing a semiconductor device. In particular, as for the method of manufacturing the semiconductor device, the present invention relates to a technique effectively applied to a method of manufacturing a semiconductor device including OCR process on a semiconductor wafer.

There is disclosed a technique listed below.
[Patent Document 1] Japanese Unexamined Patent Application Publication No. 2012-195346

Japanese Unexamined Patent Application Publication No. 2012-195346 (Patent Document 1) describes a technique for a wet processing apparatus using a Bernoulli chuck.

SUMMARY

For transporting a semiconductor wafer having a large diameter and a small thickness, using a Bernoulli chuck is suitable. However, rotating the semiconductor wafer held by the Bernoulli chuck is difficult. For this reason, in order to rotate the semiconductor wafer, it is conceivable that the semiconductor wafer transported by the Bernoulli chuck is held again by not the Bernoulli chuck but a contact-type chuck (vacuum chuck). In that case, however, there is a concern that it may take a long time for process with rotation of the semiconductor wafer or the semiconductor wafer may be damaged (chipped or the like) when the semiconductor wafer is held again by the other chuck from the Bernoulli chuck. Thus, it is desired not only to transport the semiconductor wafer by the Bernoulli chuck but also to rotate the semiconductor wafer held by the Bernoulli chuck.

Other problems and novel characteristics will become apparent from the description of the present specification and the attached drawings.

According to one embodiment, a wafer holding apparatus includes: a Bernoulli chuck having a first surface and a second surface positioned opposite to each other; and a rotating mechanism for rotating the Bernoulli chuck. A plurality of pads and a plurality of support parts are formed on the first surface of the Bernoulli chuck. In the Bernoulli chuck, by jetting gas from each of the plurality of pads, the semiconductor wafer is held. The plurality of support parts is formed at positions each deviated from a center of the first surface of the Bernoulli chuck. When the Bernoulli chuck holds the semiconductor wafer, the plurality of pads is not in contact with the semiconductor wafer while the plurality of support parts is in contact with a principal surface of the semiconductor wafer.

According to one embodiment, a method of manufacturing a semiconductor device includes: a step (a) of detecting a notch or an orientation flat of the semiconductor wafer as being held by a Bernoulli chuck; and a step (b) of, after the step (a), also rotating the semiconductor wafer held by the Bernoulli chuck together with the Bernoulli chuck by rotating the Bernoulli chuck. The method of manufacturing the semiconductor device further includes: a step (c) of, after the step (b), reading identification information provided on the semiconductor wafer in a state in which the semiconductor wafer is held by the Bernoulli chuck. A plurality of pads and a plurality of support parts are formed on a first surface of the Bernoulli chuck facing the semiconductor wafer. The plurality of support parts is formed at positions each deviated from a center of the first surface of the Bernoulli chuck. In the steps (a), (b), and (c), the semiconductor wafer is sucked toward the first surface of the Bernoulli chuck by jetting gas from each of the plurality of pads, and the semiconductor wafer is held in a state in which the plurality of pads is not in contact with the semiconductor wafer while the plurality of support parts is in contact with a principal surface of the semiconductor wafer.

According to one embodiment, the semiconductor wafer held by the Bernoulli chuck can be reliably rotated.

BRIEF DESCRIPTIONS OF THE DRAWINGS

DETAILED DESCRIPTION

Figure 1:
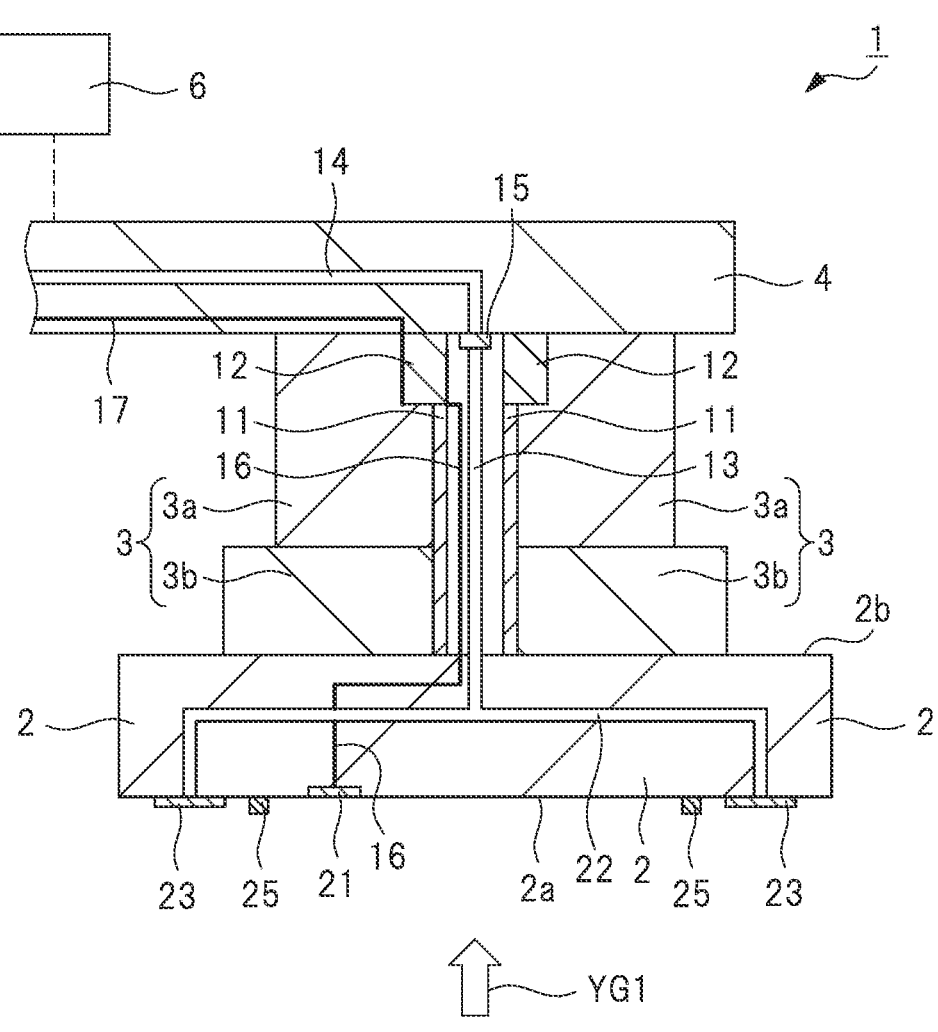
FIG. 1 is a schematic view showing a wafer holding apparatus of one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail with reference to the accompanying drawings. Note that components having the same function are denoted by the same reference signs throughout all the drawings for describing the embodiment, and the repetitive description thereof will be omitted. In the following embodiments, the description of the same or similar portions is not repeated in principle unless otherwise particularly required in the following embodiments.

Also, in some drawings used in the embodiments, hatching is omitted even in a cross-sectional view so as to make the drawings easy to see. And, hatching is used even in a plan view so as to make the drawings easy to see.

BACKGROUND OF STUDY

For transporting a semiconductor wafer having a large diameter and a small thickness, using a Bernoulli chuck is suitable. The semiconductor wafer having the large diameter and the small thickness tends to be warped. Meanwhile, when the Bernoulli chuck is used, the semiconductor wafer is not required to be closely attached to the Bernoulli chuck. Thus, even if the semiconductor wafer is warped, the semiconductor wafer can be held by the Bernoulli chuck. However, when the Bernoulli chuck is used, it is difficult to rotate the semiconductor wafer held by the Bernoulli chuck. This is because, when the Bernoulli chuck is used, it is difficult to give a torque (rotary force) to the semiconductor wafer held by the Bernoulli chuck since the semiconductor wafer and the Bernoulli chuck are not in contact with each other.

Therefore, for the OCR process on the semiconductor wafer requiring rotation of the semiconductor wafer, it is conceivable that the OCR process with the rotation of the semiconductor wafer is performed after the semiconductor wafer transported by the Bernoulli chuck is held again by not the Bernoulli chuck but a contact-type chuck (vacuum chuck). In that case, however, there is a concern that it may take a long time for the OCR process or the semiconductor wafer may be damaged (chipped or the like since the semiconductor wafer transported by using the Bernoulli chuck is held again by not the Bernoulli chuck but the contact-type chuck. Also, the semiconductor wafer having the large diameter and the small thickness tends to be warped. When not the Bernoulli chuck but the contact-type chuck is used in the OCR process, it is difficult to hold the warped semiconductor wafer by the chuck, and thus, difficult to manage the OCR process.

Accordingly, the present inventors have studied a wafer holding apparatus in which a Bernoulli chuck is adopted as a character recognition apparatus for use in, for example, the OCR process, and in which a semiconductor wafer can be reliably rotated even in a state in which the semiconductor wafer is held by the Bernoulli chuck.

<Character Recognition Apparatus>

Figure 2:
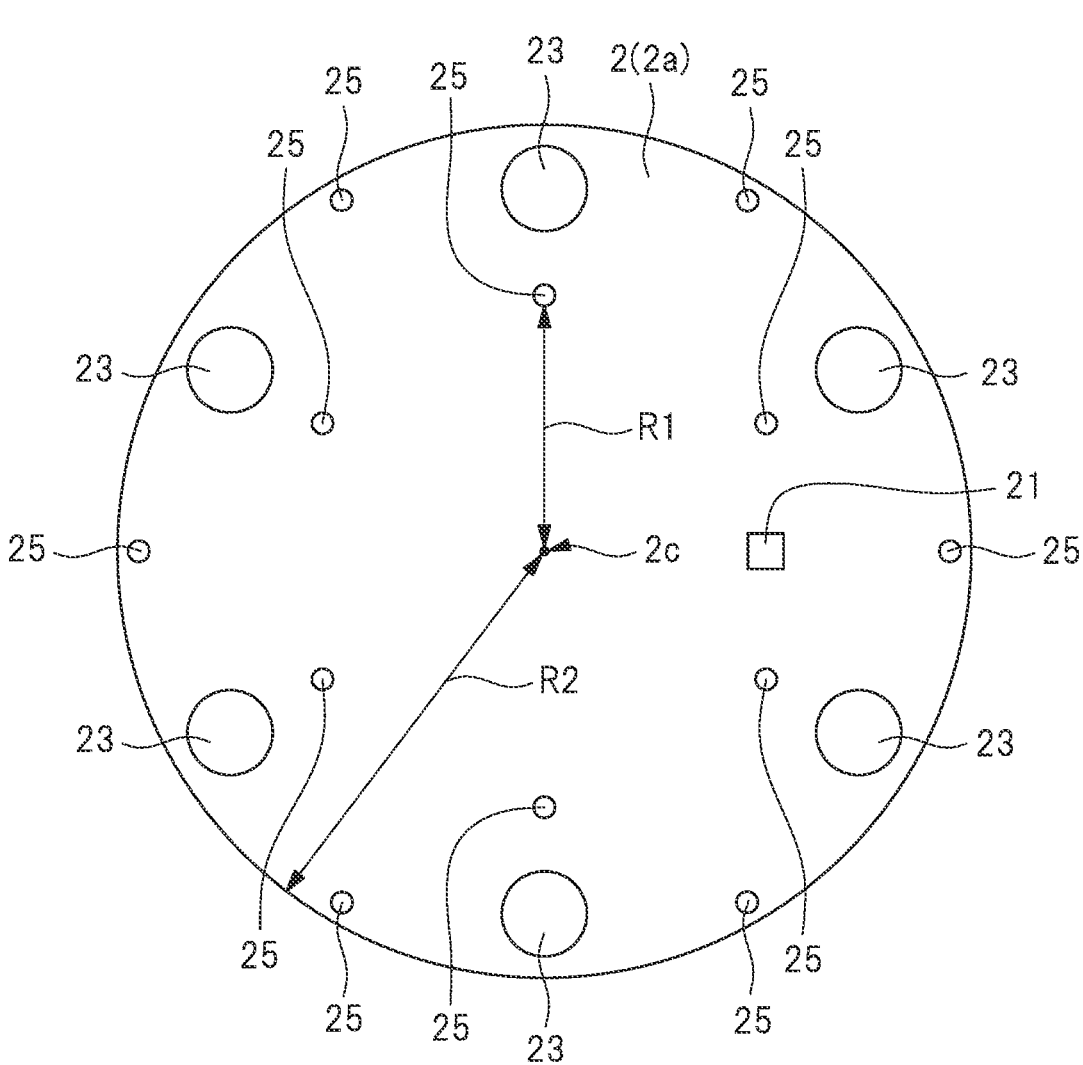
FIG. 2 is a plan view of a chuck configuring the wafer holding apparatus of FIG. 1.
Figure 3:
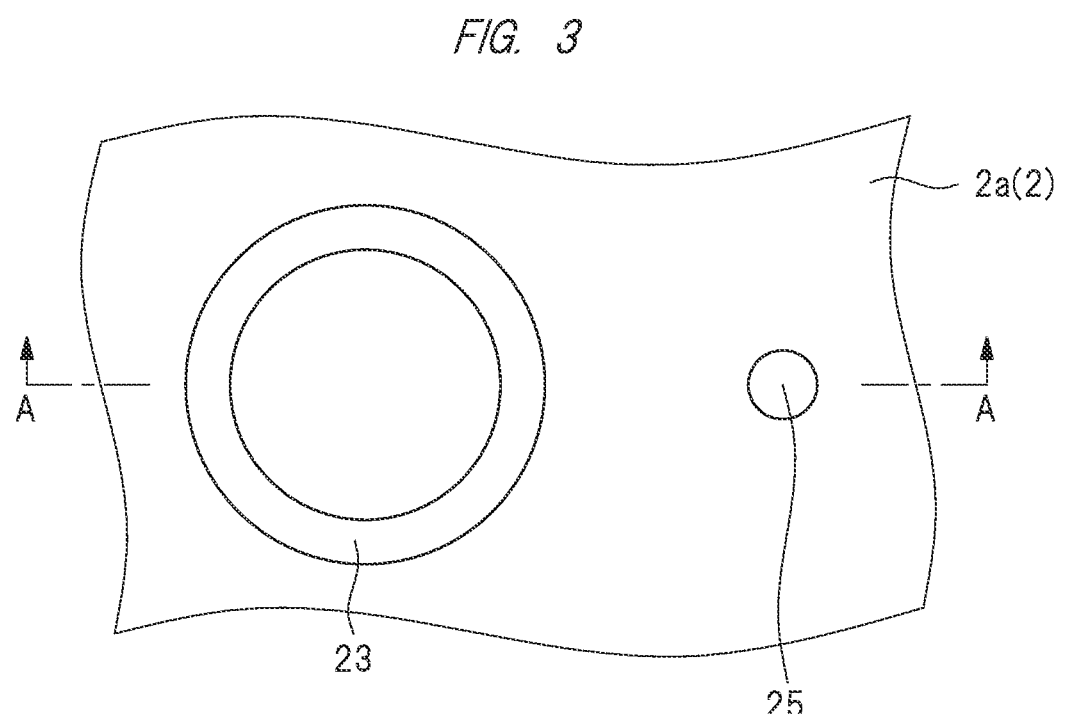
FIG. 3 is a partially enlarged plan view of a partially-enlarged chuck shown in FIG. 2.
Figure 4:
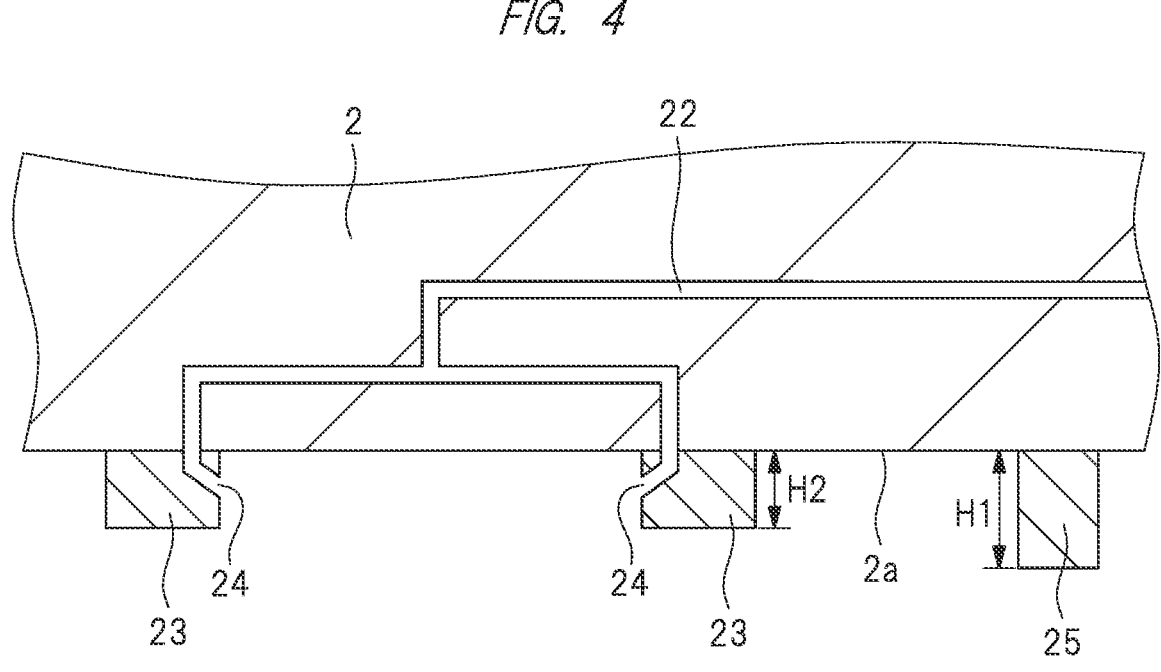
FIG. 4 is a cross-sectional view of a principal part of the chuck shown in FIG. 2.
Figure 5:
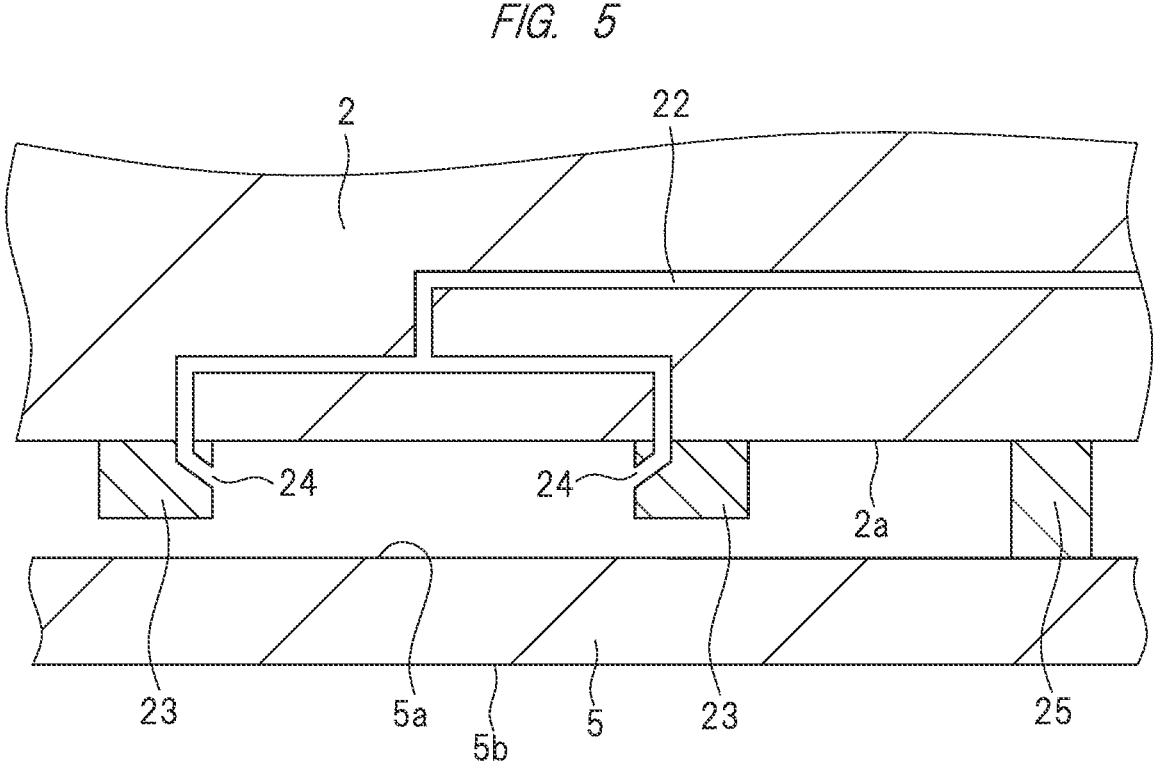
FIG. 5 is a cross-sectional view of a principal part of the chuck in a state of holding a semiconductor wafer.
Figure 6:
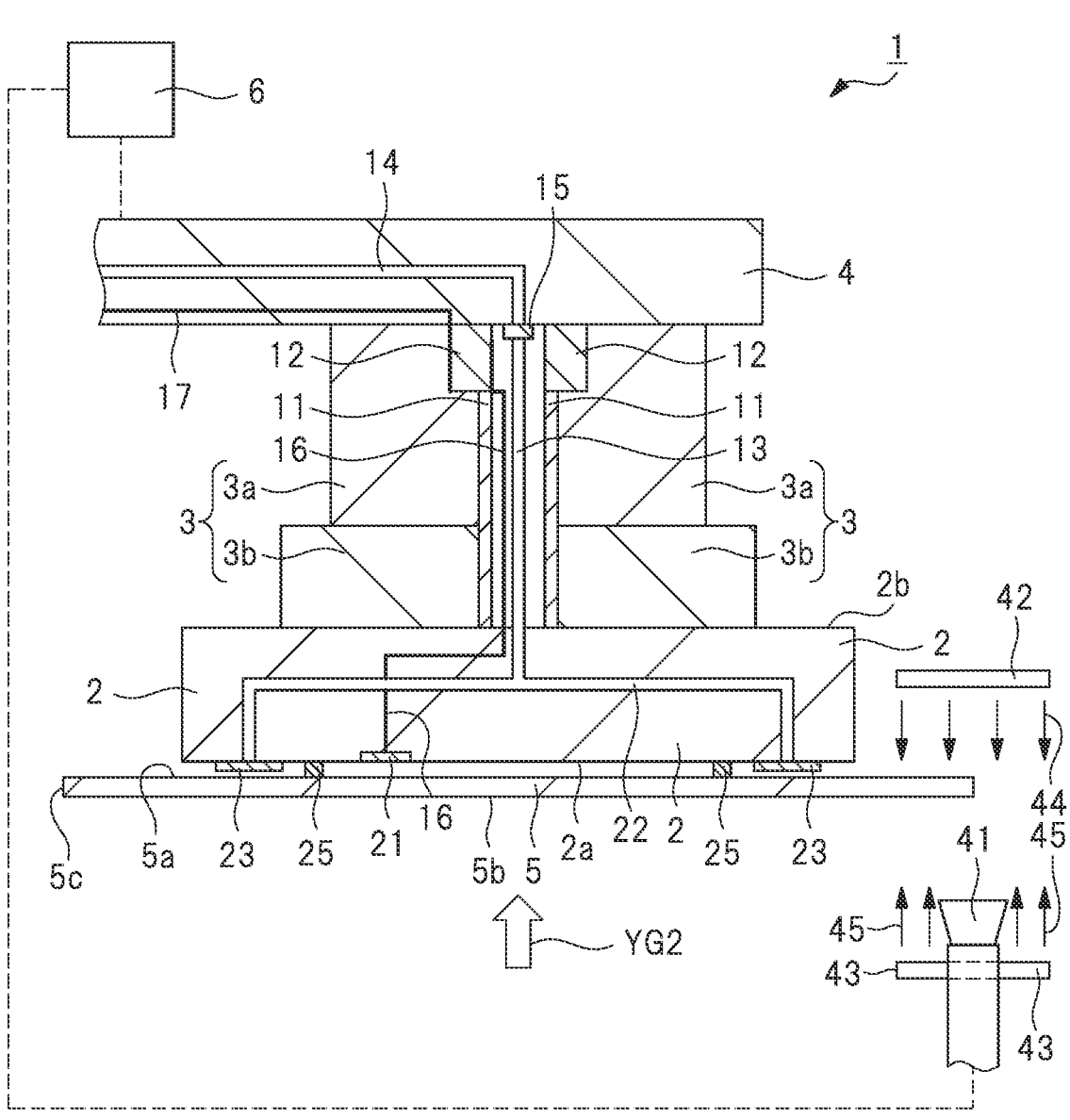
FIG. 6 is a schematic view showing the wafer holding apparatus during OCR process.
Figure 7:
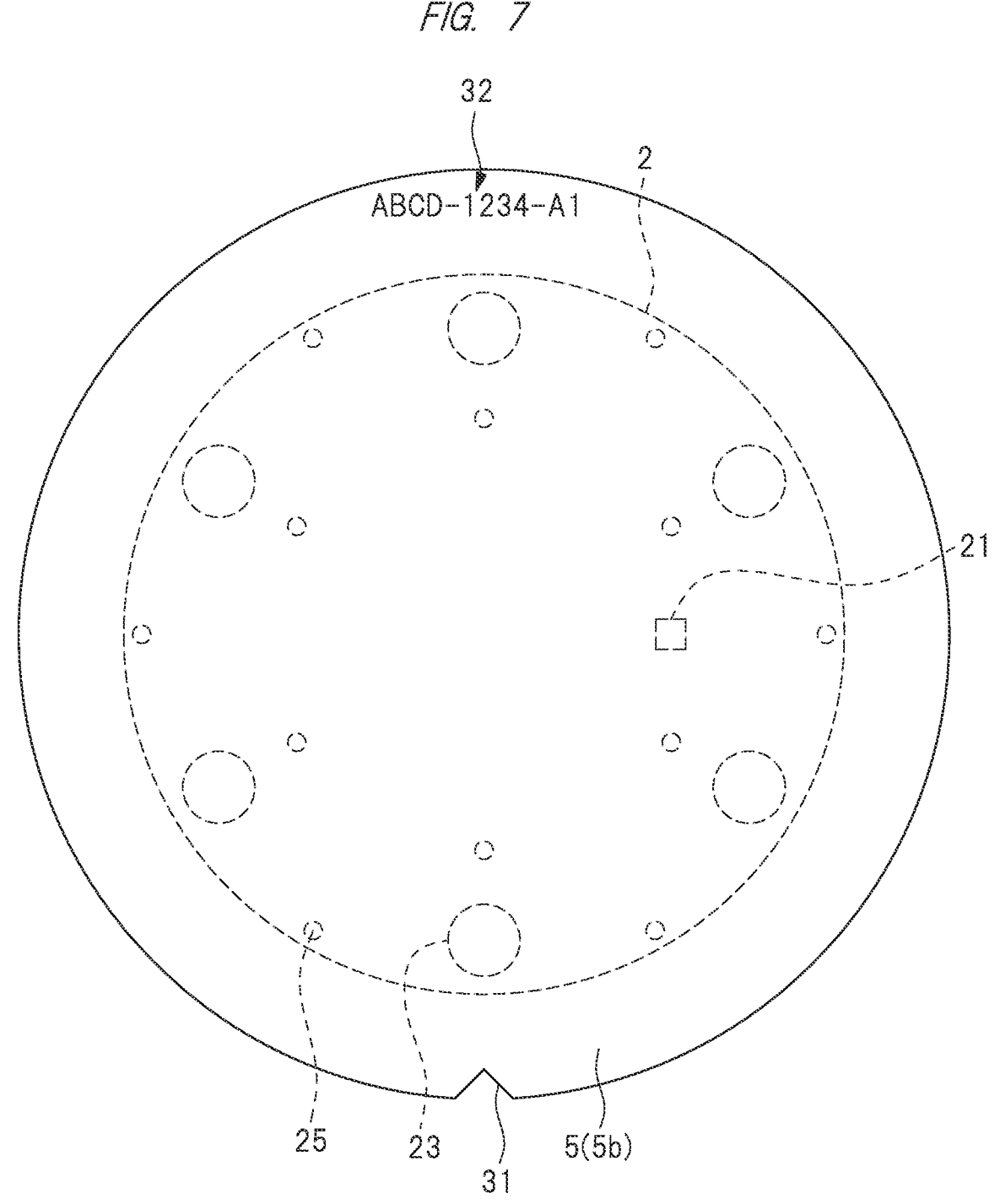
FIG. 7 is a plan view of a semiconductor wafer held by the chuck.

FIG. 1 is a schematic view (cross-sectional view) showing a character recognition apparatus 1 serving as a wafer holding apparatus of the present embodiment. FIG. 2 is a plan view of a chuck 2 of the character recognition apparatus 1 when viewed from a direction of an arrow YG1 in FIG. 1. FIG. 3 is a partially-enlarged plan view in which FIG. 2 is partially enlarged. FIG. 4 is a cross-sectional view of a principal part of the chuck 2 at a position along a line A-A in FIG. 3. FIG. 5 is also a cross-sectional view of a principal part of the chuck 2 at the same position as that of FIG. 4, but shows a cross-sectional view in a state in which the chuck 2 holds a semiconductor wafer 5. FIG. 6 is a schematic view (cross-sectional view) showing the character recognition apparatus 1 during the OCR process. In FIG. 6, the semiconductor wafer 5 is held by the chuck 2 configuring the character recognition apparatus 1. FIG. 7 is a plan view of the semiconductor wafer 5 held by the chuck 2 when viewed from a direction of an arrow YG2 in FIG. 6. In FIG. 7, for ease of understanding, the positions of the chuck 2, a load-presence sensor 21, pads 23, and support parts 25 provided when the semiconductor wafer 5 is seen through are indicated by dotted lines.

As shown in FIG. 1 to FIG. 7, the character recognition apparatus (wafer holding apparatus) 1 includes: the chuck 2 (Bernoulli chuck, wafer chuck, or wafer holding part) 2 for holding the semiconductor wafer (semiconductor substrate) 5; a rotating mechanism (rotating apparatus) 3 for rotating the chuck 2; and an arm part 4 which enables movements of the chuck 2 and the rotating mechanism 3. The character recognition apparatus 1 can function as a wafer holding apparatus capable of holding the semiconductor wafer 5 and rotating the held semiconductor wafer 5.

The chuck 2 is a Bernoulli chuck. The chuck 2 has a surface 2a (hereinafter referred to as a facing surface 2a) facing the semiconductor wafer 5 when the semiconductor wafer 5 is held and a surface 2b opposite to the facing surface 2a. The facing surface 2a of the chuck 2 is substantially perpendicular to a rotation axis direction in the rotation of the chuck 2. The semiconductor wafer 5 has a principal surface 5a and a principal surface 5b positioned opposite to each other and a side surface 5c connecting the principal surface 5a and the principal surface 5b. When the chuck 2 holds the semiconductor wafer 5, the facing surface 2a of the chuck 2 and the principal surface 5a of the semiconductor wafer 5 face each other. Therefore, the facing surface 2a of the chuck 2 can be regarded as a surface (wafer holding surface) of holding the semiconductor wafer 5.

The rotating mechanism 3 is arranged on the surface 2b of the chuck 2. The rotating mechanism 3 has a function of rotating the chuck 2, and is, for example, a rotary actuator. The rotating mechanism 3 has a body part 3a and a rotating shaft 3b. The chuck 2 is attached to the rotating shaft 3b of the rotating mechanism 3. The body part 3a of the rotating mechanism 3 is attached to the arm part 4. The rotating mechanism 3 can rotate the rotating shaft 3b with respect to the body part 3a. Therefore, it is possible to also rotate the chuck 2 attached to the rotating shaft 3b together with the rotating shaft 3b. The arm part 4 can move the chuck 2 and the rotating mechanism 3 in a horizontal direction and an up-down direction when the arm part 4 move in the horizontal direction and the up-down direction.

The character recognition apparatus 1 also includes a control part 6 which controls the operation of the character recognition apparatus 1. The control part 6 includes, for example, a control-purpose semiconductor device (processor), a storage-purpose semiconductor device (memory), and so forth.

The chuck 2 is rotatably attached to the arm part 4. Specifically, a hollow shaft (hollow path) 11 is coupled to the chuck 2, and the hollow shaft 11 is coupled to the arm part 4 via a slip ring 12. The rotating mechanism 3 is arranged around the hollow shaft 11 to surround the hollow shaft 11. The hollow shaft 11 rotates together with the rotating shaft 3b and the chuck 2. The hollow shaft 11 has a cylindrical shape with its inside hollowed out. A pipe 13 for supplying gas to the chuck 2 passes through the inside of the hollow shaft 11 and further through the inside of the slip ring 12. One end portion of the pipe 13 is connected to a pipe 14 inside the arm part 4 via a rotary joint 15. The rotary joint 15 interposes between the pipe 13 and the pipe 14 inside the arm part 4. Therefore, even if the pipe 13 rotates along with the rotation of the chuck part 2, gas can be supplied from the pipe 14 inside the arm part 4 to the pipe 13.

The chuck 2 includes the load-presence sensor 21. The load-presence sensor 21 is provided on the facing surface 2a of the chuck 2. By the load-presence sensor 21, it can be detected whether the semiconductor wafer 5 is present at a position at which the semiconductor wafer 5 faces the facing surface 2a of the chuck 2.

A wire 16 electrically connected to the load-presence sensor 21 passes through the inside of the chuck 2 and the inside of the hollow shaft 11 to be electrically connected to a wire 17 provided to the arm part 4 via the slip ring 12. The slip ring 12 is arranged between the hollow shaft 11 and the arm part 4. Even if the chuck 2 and the hollow shaft 11 rotate, the electrical connection between the wire 16 and the wire 17 via the slip ring 12 is maintained.

The pipe 13 is connected to a flow path (gas flow path) 22 inside the chuck 2, and gas supplied from the pipe 14 inside the arm part 4 to the pipe 13 is supplied to the flow path 22 inside the chuck 2. The gas supplied from the pipe 14 inside the arm part 4 via the pipe 13 to the flow path 22 of the chuck 2 is preferably air, and more preferably compressed air.

On the facing surface 2a of the chuck 2, a plurality of pads (cyclone pads) 23 and a plurality of support parts (protruding parts or holding parts) 25 are provided. Each of the pads 23 has a function of pulling up (suctioning) and holding the semiconductor wafer 5 by a jet of gas. The support parts 25 are portions in contact with the principal surface 5a of the semiconductor wafer 5 when the chuck 2 holds the semiconductor wafer 5.

Each pad 23 has a nozzle 24 serving as a jet-gas outlet, and a swirl flow can be generated by the jet of gas from that nozzle 24. Specifically, each pad 23 has a cylindrical shape, and the nozzle 24 is provided on an inner side surface (inner wall) or an inner bottom surface of that cylindrical shape. The nozzle 24 is formed in, for example, an annular shape. The gas jetted from the nozzle 24 is gas supplied from the pipe 13 to the flow path 22, and is preferably air, and more preferably compressed air.

The gas supplied from the pipe 13 to the flow path 22 inside the chuck 2 passes through the flow path 22 and is jetted from the nozzle 24 of each pad 23. The gas jetted from the nozzle 24 of each pad 23 becomes the swirl flow inside the cylindrical shape configuring the pad 23 to produce a vacuum (so-called cyclone effect). The gas jetted from the nozzle 24 of each pad 23 is discharged from a space between the facing surface 2a of the chuck 2 and the semiconductor wafer 5 to the atmosphere. As a result, a gas layer is generated between the pads 23 and the semiconductor wafer 5, and the semiconductor wafer 5 can be pulled up to a direction of approaching the pads 23 and held, without a contact between the pads 23 and the semiconductor wafer 5. By the cyclone effect and Bernoulli effect caused when the pads 23 jets the gas, the semiconductor wafer 5 is pulled up (suctioned) toward the facing surface 2a of the chuck 2 and held.

The support parts 25 provided on the facing surface 2a of the chuck 2 protrude from the facing surface 2a of the chuck 2. That is, the support parts 25 are protruding parts formed on the facing surface 2a of the chuck 2. The support parts 25 each have a height H1 higher than a height H2 of each pad 23 (H1>H2, see FIG. 4). That is, the height position of the end of each support part 25 is higher than the height position of a vertex part of the pad 23. Here, when the chuck 2 holds the semiconductor wafer 5, a height in a direction of approaching the semiconductor wafer 5 is assumed to be high and a height in a direction of going away from the semiconductor wafer 5 is assumed to be low.

As can be seen from FIG. 5 and FIG. 6, while the chuck 2 is holding the semiconductor wafer 5 by the jet of gas from the nozzle 24 of each pad 23, each pad 23 and the semiconductor wafer 5 do not make contact with each other, but the end of each support part 25 is in contact with the semiconductor wafer 5. Thus, the height H1 of each support part 25 is set so that the end of each support part 25 can become in contact with the semiconductor wafer 5 while the chuck 2 is holding the semiconductor wafer 5 by the jet of gas from the nozzle 24 of each pad 23.

While the chuck 2 is holding the semiconductor wafer 5 by the jet of gas from the nozzle 24 of each pad 23, each pad 23 and the semiconductor wafer 5 do not make contact with each other, but the end of each support part 25 is in contact with the principal surface 5a of the semiconductor wafer 5. Since the end of each support part 25 is in contact with the principal surface 5a of the semiconductor wafer 5, the support parts 25 making contact with the principal surface 5a of the semiconductor wafer 5 give a rotary force to the semiconductor wafer 5 when the rotating mechanism 3 rotates the chuck 2, and the semiconductor wafer 5 can be rotated together with the chuck 2. On the other hand, since the pads 23 do not make contact with the semiconductor wafer 5, the semiconductor wafer 5 does not inhibit the jet of gas from the nozzle 24 of each pad 23.

Therefore, when the gas is jetted from the nozzle 24 of each pad 23 in a state in which the principal surface 5a of the semiconductor wafer 5 to be held faces the facing surface 2a of the chuck 2, the semiconductor wafer 5 can be pulled up to a direction of approaching the facing surface 2a of the chuck 2 and can be held in a state in which the principal surface 5a of the semiconductor wafer 5 is in contact with the end of each support part 25. Then, when the rotating mechanism 3 rotates the chuck 2, the semiconductor wafer 5 can be rotated together with the chuck 2 since the support parts 25 are in contact with the principal surface 5a of the semiconductor wafer 5.

In the present embodiment, the plurality of support parts 25 is provided on the facing surface 2a of the chuck 2 at positions each deviated from a center 2c of the facing surface 2a of the chuck 2. Here, the center 2c of the facing surface 2a of the chuck 2 corresponds to a rotation center on the facing surface 2a in the rotation of the chuck 2.

When the support parts 25 are provided at the center 2c of the facing surface 2a of the chuck 2, the support parts 25 cannot give the rotary force to the semiconductor wafer 5 in the rotation of the chuck 2. On the other hand, the support parts 25 provided at positions each deviated from the center 2c of the facing surface 2a of the chuck 2 can give the rotary force (rotation moment force) to the semiconductor wafer 5 in the rotation of the chuck 2. In the present embodiment, the plurality of support parts 25 is provided at positions each deviated from the center 2c of the facing surface 2a of the chuck 2 on the facing surface 2a of the chuck 2. By the rotation of the chuck 2 in the state in which the plurality of these support parts 25 is in contact with the principal surface 5a of the semiconductor wafer 5, the semiconductor wafer 5 held by the chuck 2 can be rotated together with the chuck 2.

In this manner, the support parts 25 have a function of giving the rotary force (rotation moment force) to the semiconductor wafer 5 in the rotation of the chuck 2. The plurality of (two or more) support parts 25 is provided at positions each deviated from the center 2c of the facing surface 2a on the facing surface 2a of the chuck 2. However, in order to reliably rotate the semiconductor wafer 5, three or more support parts 25 are preferably provided at positions each deviated from the center 2c of the facing surface 2a.

Also, the facing surface 2a of the chuck 2 preferably has a circular shape. This allows the circular-shaped semiconductor wafer 5 to be efficiently held by the chuck 2, and also allows the dimensions of the chuck 2 to be prevented from being unnecessarily increased.

As a distance $R_1$ from the center 2c of the facing surface 2a of the chuck 2 to each support part 25 is larger, this support part 25 can give a larger rotary force to the semiconductor wafer 5 in the rotation of the chuck 2. Thus, each support part 25 is preferably provided at a position where the distance $R_1$ from the center 2c of the facing surface 2a of the chuck 2 is equal to or larger than one-third of a radius $R_2$ of the facing surface 2a of the chuck 2. That is, when a distance between the support part 25 and the center 2c of the facing surface 2a of the chuck 2 is assumed to be $R_1$ while the radius of the facing surface 2a of the chuck 2 is assumed to be $R_2$, each support part 25 is preferably provided at a position where "$R_1 \geq R_2/3$" is established on the facing surface 2a of the chuck 2. This allows the semiconductor wafer 5 to be more reliably rotated together with the chuck 2.

Also, when the chuck 2 holds the semiconductor wafer 5, if the semiconductor wafer 5 is warped or tilted, there is a risk of the contact of the semiconductor wafer 5 with the pad 23 of the chuck 2 to inhibit the jet of gas from the nozzle 24 of the pad 23. Thus, in the present embodiment, as shown in FIG. 2, on the facing surface 2a of the chuck 2, the pads 23 and the support parts 25 are arranged so that each pad 23 is surrounded by a plurality of support parts 25 and the edge (outer circumference) of the facing surface 2a. That is, on the facing surface 2a of the chuck 2, each of the plurality of pads 23 is surrounded by a plurality of support parts 25 and the edge of the facing surface 2a in plan view. In this manner, the semiconductor wafer 5 can be more reliably prevented from making contact with the pads 23 of the chuck 2 when the chuck 2 holds the semiconductor wafer 5. As a result, the jet of gas from the nozzle 24 of each pad 23 can be more reliably prevented from being inhibited by the semiconductor wafer 5.

In the present embodiment, note that a plan view corresponds to a view when viewed on a plane substantially parallel to the facing surface 2a of the chuck 2.

In points of view of easiness of the giving of the rotary force to the semiconductor wafer 5 by the support parts 25 and easiness of prevention of unnecessary force from being applied to the semiconductor wafer 5 in the rotation of the chuck 2, an elastic body is preferable as a material configuring the support parts 25, and rubber is more preferable. On the other hand, in a point of view of protection of the semiconductor wafer 5, a resin (resin material) is preferable as a material configuring the support parts 25. When the support parts 25 are made of the resin, adhesion of undesirable substances onto the semiconductor wafer 5 is easily prevented even if the support parts 25 make contact with the principal surface 5a of the semiconductor wafer 5. Other than those, the support parts 25 can be made of any of various materials such as a metal.

Also, each support part 25 can have, for example, a columnar shape, a cylindrical shape, or the like. The support parts 25 may be bonded to the facing surface 2a of the chuck 2 with a bonding agent or the like, or the support parts 25 may be fixed to the facing surface 2a of the chuck 2 by using fixing members such as screws.

Furthermore, in a point of view of suppressing an influence of the contact of the support parts 25 with the principal surface 5a of the semiconductor wafer 5 as much as possible, the planar dimension (planar area) of each support part 25 is desirably not too large. In this point of view, the planar dimension (planar area) of each support part 25 is preferably equal to or smaller than 15.7 mm². Here, the planar dimension of each support part 25 corresponds to the area of each support part 25 in the plan view.

Still further, in the present embodiment, the end of each support part 25 has a circular planar shape, and the end of each pad 23 has a ring (doughnut) planar shape. In another embodiment, the end of each support part 25 can have a ring (doughnut) planar shape as similar to the pad 23.

Still further, on the facing surface 2a of the chuck 2, the plurality of support parts 25 is arranged to be preferably balanced well. For example, as also shown in FIG. 2, on the facing surface 2a of the chuck 2, the plurality of support parts 25 is preferably arranged at symmetrical positions (symmetrical across the center 2c of the facing surface 2a). This allows the semiconductor wafer 5 held by the chuck 2 to be more reliably prevented from being warped or tilted.

Still further, on the facing surface 2a of the chuck 2, the plurality of pads 23 is arranged to be preferably balanced well. For example, as also shown in FIG. 2, on the facing surface 2a of the chuck 2, the plurality of pads 23 is preferably arranged at symmetrical positions (symmetrical across the center 2c of the facing surface 2a). This allows the semiconductor wafer 5 to be more reliably held by the chuck 2.

Still further, the plurality of pads 23 is preferably arranged on a peripheral portion of the facing surface 2a of the chuck 2. In FIG. 2, the plurality of pads 23 is arranged along the edge (outer circumference) of the facing surface 2a to be approximately equidistant from one another on the peripheral portion of the facing surface 2a of the chuck 2. This allows the semiconductor wafer 5 to be more reliably held by the chuck 2, and warping and tilting of the semiconductor wafer 5 held by the chuck 2 are easily suppressed and prevented.

Still further, in the present embodiment, as can be seen from FIG. 2, no support part 25 is provided at the position of the center 2c of the facing surface 2a of the chuck 2. In another embodiment, on the facing surface 2a of the chuck 2, the support part 25 can be provided at not only the position deviated from the center 2c but also a position matching the center 2c. That is, in FIG. 2, the support part 25 may be added also at the position matching the center 2c of the facing surface 2a. However, the support part 25 arranged at the center 2c of the facing surface 2a cannot give the rotary force to the semiconductor wafer 5. Also, a resonance phenomenon is more difficult to occur in the semiconductor wafer 5 held by the chuck 2 in the case without the support part 25 arranged at the center 2c of the facing surface 2a than the case with the support part 25 arranged also at the position matching the center 2c of the facing surface 2a. Thus, the case without the support part 25 arranged at the center 2c of the facing surface 2a is more preferable than the case with the support part 25 arranged also at the position matching the center 2c of the facing surface 2a.

Still further, in points of view of allowing the rotary force to be reliably given to the semiconductor wafer 5 by the support parts 25 and suppressing the occurrence of the resonance phenomenon in the semiconductor wafer 5 held by the chuck 2 as much as possible, it is more preferable not to arrange the support part 25 at a position at which a distance from the center of the facing surface 2a is smaller than one-third of the radius $R_2$ of the facing surface 2a. Also, in a point of view of allowing the chuck 2 to reliably hold the semiconductor wafer, it is more preferable not to arrange the pad 23 at a position at which a distance from the center of the facing surface 2a is smaller than one-third of the radius $R_2$ of the facing surface 2a.

In the present embodiment, when the chuck 2 holds the semiconductor wafer 5, the support parts 25 are in contact with not the side surface 5c of the semiconductor wafer 5 but the principal surface 5a of the semiconductor wafer 5.

As different from the present embodiment, it can also be thought that the support part is provided on the facing surface 2a of the chuck 2 so as to be in contact with the side surface 5c of the semiconductor wafer 5, and this case is hereinafter referred to as a study example. In the study example, in the rotation of the chuck 2, the support part making contact with the side surface 5c of the semiconductor wafer 5 gives the rotary force to the semiconductor wafer 5, and can rotate the semiconductor wafer 5.

However, in the study example, the support parts are required to be provided on the facing surface 2a of the chuck 2 so as to be in contact with the side surface 5c of the semiconductor wafer 5. Thus, the planar dimension of the chuck 2 is undesirably significantly larger than the planar dimension of the semiconductor wafer 5. This leads to an increase in the size of the chuck 2. Also, if the planar dimension of the chuck 2 is larger than the planar dimension of the semiconductor wafer 5, it is difficult in the OCR process to detect the notch of the semiconductor wafer 5 held by the chuck 2. Also, in the study example, when the support parts are in contact with the side surface 5c of the semiconductor wafer 5, a force pushing the semiconductor wafer 5 from a side surface side of the semiconductor wafer 5 acts, and therefore, the risk of occurrence of chipping or breakage in the semiconductor wafer 5 increases. This is because the act of the force pushing the semiconductor wafer 5 from the side surface side of the thin semiconductor wafer 5 easily causes the chipping or breakage in the semiconductor wafer 5.

On the other hand, in the present embodiment, the support parts 25 provided on the facing surface 2a of the chuck 2 are in contact with not the side surface 5c of the semiconductor wafer 5 but the principal surface 5a of the semiconductor wafer 5, and therefore, the chuck 2 can be downsized (reduced in area). For example, the planar dimension (planar area) of the chuck 2 can be made smaller than the planar dimension (planar area) of the semiconductor wafer 5. Thus, in the OCR process, the notch of the semiconductor wafer 5 held by the chuck 2 can be easily detected. Also, the risk of occurrence of chipping or breakage in the semiconductor wafer 5 can be reduced. Even if the force of the support parts 25 in contact with the principal surface 5a of the semiconductor wafer 5 acts to push the principal surface 5a of the semiconductor wafer 5, the risk of occurrence of chipping or breakage in the semiconductor wafer 5 is very small. Thus, in the present embodiment, the OCR process can be reliably performed, and the process management of the OCR process is facilitated.

Still further, the semiconductor wafer 5 has a notch or an orientation flat (see FIG. 7). In the present embodiment, the case in which the semiconductor wafer 5 has a notch 31 will be explained. However, the semiconductor wafer 5 may have the orientation flat in place of the notch 31. If the semiconductor wafer 5 has the orientation flat in place of the notch 31, "notch" can be read as "orientation flat" in the explanation for the present embodiment.

Still further, the semiconductor wafer 5 has information (identification information) 32 provided as a printed character, an engraved mark, or the like on its principal surface 5b (see FIG. 7). The information 32 provided onto the principal surface 5b of the semiconductor wafer 5 is wafer identification information (wafer identification number) for identifying that semiconductor wafer 5. The information 32 is configured of, for example, a number, a character, a sign, or a combination of these.

Still further, a thickness of the semiconductor wafer 5 is, for example, equal to or smaller than 150 μm. Even such a thin semiconductor wafer 5 can be reliably held by the chuck 2 because the Bernoulli chuck is adopted as the chuck 2. A diameter of the semiconductor wafer 5 is, for example, equal to or larger than 200 mm.

Still further, the character recognition apparatus 1 of the present embodiment further has an image sensor 41 and lighting fixtures (light sources) 42 and 43 (see FIG. 6). The image sensor 41 is used to detect the notch 31 of the semiconductor wafer 5 and to read the information 32 provided on the principal surface 5b of the semiconductor wafer 5. The image sensor 41 can be regarded as an identifying part (identifying means) capable of identifying the notch 31 and the information 32.

The lighting fixture 42 is used when the image sensor 41 detects the notch 31 of the semiconductor wafer 5, and the lighting fixture 43 is used when the image sensor 41 reads the information 32 of the semiconductor wafer 5. The lighting fixture 42 can emit light to the principal surface 5a of the semiconductor wafer 5 held by the chuck 2, and the lighting fixture 43 can emit light to the principal surface 5b of the semiconductor wafer 5 held by the chuck 2. Thus, the light emitting direction of the lighting fixture 42 is opposite to that of the lighting fixture 43.

<Steps of Manufacturing Semiconductor Device>

First, the semiconductor wafer 5 is prepared.

Various steps are performed on the prepared semiconductor wafer 5 to manufacture the semiconductor device. Prior to this, a step of reading the information 32 provided on the principal surface 5b of the semiconductor wafer 5, so-called OCR (Optical Character Recognition/Reader) process, is performed. The OCR process will be explained below.

<<OCR Process>>

Figure 8:
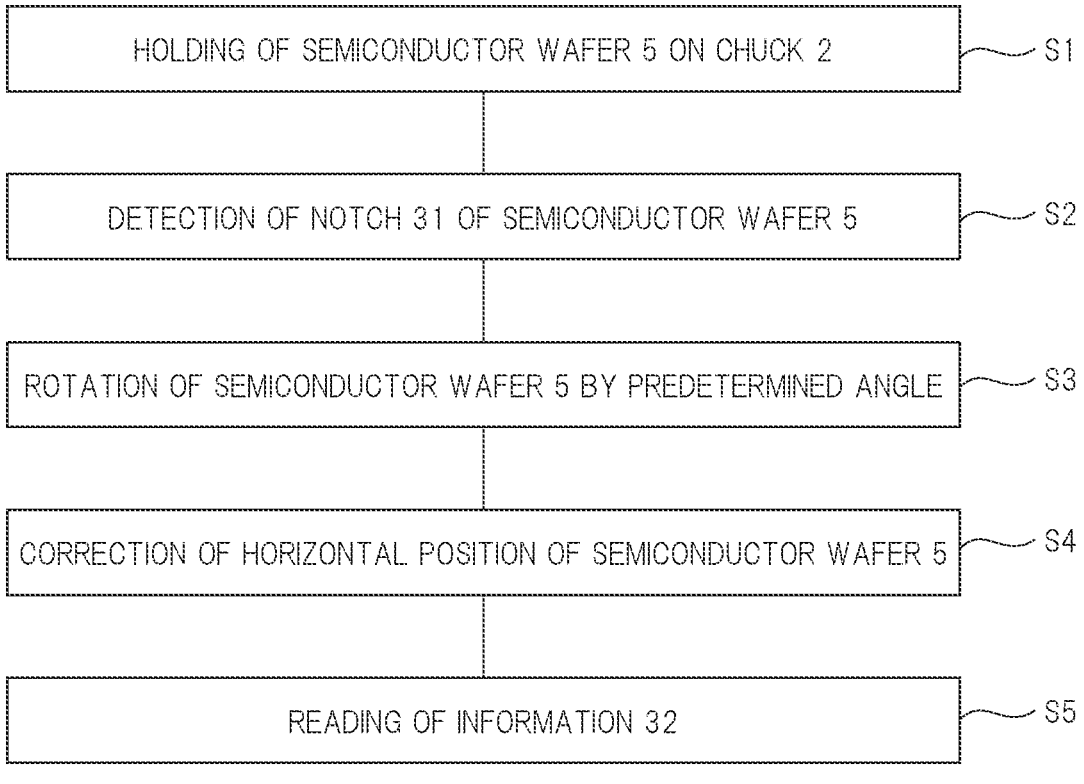
FIG. 8 is an explanatory diagram for explaining the OCR process.

FIG. 8 is an explanatory diagram (flowchart) for explaining the OCR process. The OCR process will be explained with reference to FIG. 6 to FIG. 8.

First, the semiconductor wafer 5 is held by the chuck 2 of the character recognition apparatus 1 described above (step S1 of FIG. 8). At step S1, specifically, the gas is jetted from (the nozzle 24 of) each of the plurality of pads 23 provided on the facing surface 2*a* of the chuck 2 in the state in which the principal surface 5*a* of the semiconductor wafer 5 to be held faces the facing surface 2*a* of the chuck 2. In this manner, the semiconductor wafer 5 is pulled up toward the facing surface 2*a* of the chuck 2 to cause the state in which the principal surface 5*a* of the semiconductor wafer 5 is in contact with the end of each support parts 25. In that state, the semiconductor wafer 5 is held by the chuck 2. Then, the control part 6 operates the arm part 4 to move the chuck 2 and the semiconductor wafer 5 held by the chuck to positions where the edge (outer circumference) of the semiconductor wafer 5 held by the chuck 2 can be detected by the image sensor 41 as seen in FIG. 6.

Next, the notch 31 of the semiconductor wafer 5 held by the chuck 2 is detected by the image sensor 41 (step S2 of FIG. 8). Specifically, the control part 6 rotates the semiconductor wafer 5 held by the chuck 2 together with the chuck 2 by causing the rotating mechanism 3 to rotate the chuck 2. Outline images of the of the rotating semiconductor wafer 5 are successively taken by the image sensor 41, and, when the image sensor 41 recognizes (detects) the notch 31 of the semiconductor wafer 5, the control part 6 stops the rotation of the semiconductor wafer 5 by stopping the rotation of the chuck 2 rotated by the rotating mechanism 3. Also at step S2, as described above, since the end of each support part 25 is in contact with the principal surface 5*a* of the semiconductor wafer 5 held by the chuck 2, the support parts 25 in contact with the semiconductor wafer 5 give the rotary force to the semiconductor wafer 5 when the rotating mechanism 3 rotates the chuck 2, and the semiconductor wafer 5 can be rotated together with the chuck 2. Also at step S2, while the outer circumferential portion of the principal surface 5*a* of the semiconductor wafer 5 is radiated with light 44 from the lighting fixture 42, the outline images of the semiconductor wafer 5 are taken by the image sensor 41. This allows the outline of the semiconductor wafer 5 to be easily distinguished by the image sensor 41, and the notch 31 of the semiconductor wafer 5 can be reliably detected by the image sensor 41. At step S2, the lighting fixture 42 is positioned to face the outer circumferential portion of the principal surface 5*a* of the semiconductor wafer 5 held by the chuck 2. At step S2, radiation of the light from the lighting fixture 43 is not required.

Next, the semiconductor wafer 5 is rotated by a predetermined angle (step S3 of FIG. 8). Specifically, the control part 6 causes the rotating mechanism 3 to rotate the chuck 2 by a predetermined angle to rotate the semiconductor wafer 5 held by the chuck 2 together with the chuck 2 by the predetermined angle. In this case, the semiconductor wafer 5 is rotated so that the image sensor 41 can read the information 32 provided on the principal surface 5*b* of the semiconductor wafer 5. On the principal surface 5*b* of the semiconductor wafer 5, a relative positional relation between the position of the notch 31 and the position where the information 32 is provided is previously provided. Thus, if the notch 31 is detected at step S2, the semiconductor wafer 5 can be rotated at step S3 to a rotation position where the image sensor 41 can read the information 32.

For example, as seen in FIG. 7, if a difference between the angular position of the information 32 and the angular position of the notch 31 on the principal surface of the semiconductor wafer 5 is 180°, the semiconductor wafer 5 is only required to rotate by 180 degrees at step S3. In this manner, the rotation position of the semiconductor wafer 5 at the end of step S3 is a rotation position where the image sensor 41 can read the information 32 provided on the principal surface 5*a* of the semiconductor wafer 5. Also at step S3, as described above, since the end of each support part 25 is in contact with the principal surface 5*a* of the semiconductor wafer 5 held by the chuck 2, the support parts 25 in contact with the semiconductor wafer 5 give the rotary force to the semiconductor wafer 5 when the rotating mechanism 3 rotates the chuck 2, and the semiconductor wafer 5 can be rotated together with the chuck 2.

Next, the outline of the semiconductor wafer 5 is observed by using the image sensor 41 to correct the horizontal position of the semiconductor wafer 5 (step S4 of FIG. 8). For example, the control part 6 causes the image sensor 41 to detect the position of the vertex of the outline of the semiconductor wafer 5, and causes the arm part 4 to operate so that the position of that vertex matches a predetermined reference position to move the semiconductor wafer 5 in the horizontal direction. Since the chuck 2 is moved in the horizontal direction by the operation of the arm part 4, the semiconductor wafer 5 held by the chuck 2 can be also moved in the horizontal direction.

Next, the information 32 provided on the principal surface 5*b* of the semiconductor wafer 5 is read by the image sensor 41 (step S5 of FIG. 8). At step S5, while the outer circumferential portion of the principal surface 5*b* of the semiconductor wafer 5 is radiated with light 45 from the lighting fixture 43, the information 32 provided on the principal surface 5*b* of the semiconductor wafer 5 is read by the image sensor 41. This allows the information 32 provided on the principal surface 5*b* of the semiconductor wafer 5 to be easily distinguished by the image sensor 41, and the information 32 can be reliably read by the image sensor 41. At step S5, the lighting fixture 43 is positioned to face the outer circumferential portion of the principal surface 5*b* of the semiconductor wafer 5 held by the chuck 2. Thus, the lighting fixture 42 and the lighting fixture 43 are opposite to each other so as to sandwich the semiconductor wafer 5 therebetween. At step S5, radiation of light from the lighting fixture 42 is not required. Also at step S5, the semiconductor wafer 5 is not required to be rotated.

Based on the information 32 read at step S5, the semiconductor wafer 5 can be identified. In the various subsequent steps, the information 32 read at step S5 can be used. Furthermore, the information 32 read at step S5 can be used also to manage various steps, to manage manufactured products, and so forth.

Step S2, step S3, step S4, and step S5 are performed in a state in which the semiconductor wafer 5 is held on the chuck 2 by the jet of the gas from (the nozzle 24 of) each of the plurality of pads 23 provided on the facing surface 2*a* of the chuck 2.

Then, the semiconductor wafer 5 is transported, and the various steps are performed on the semiconductor wafer 5 to manufacture the semiconductor device.

In the OCR process, after the notch 31 of the semiconductor wafer 5 is detected at step S2, the semiconductor wafer 5 is rotated at step S3 by the predetermined angle, and the information 32 provided on the principal surface 5*b* of the semiconductor wafer 5 is read at step S5. If the position of the notch in each of the plurality of prepared semiconductor wafers is always constant and its position is previously provided, the position of the notch in each individual semiconductor wafer is not required to be detected at step S2, but this situation is not easily achieved. Thus, the above-described step S2, step S3, step S4, and step S5 are required to be performed for each of the plurality of prepared semiconductor wafers. That is, before step S5 is performed, the semiconductor wafer 5 is required to be rotated at step S2 and step S3. In the present embodiment, because of the jet of gas from each pad 23, the chuck 2 holds the semiconductor wafer 5 in the state in which the principal surface 5a of the semiconductor wafer 5 is in contact with the end of each support part 25. Thus, in the rotation of the chuck 2, the support parts 25 give the rotary force to the semiconductor wafer 5, and the semiconductor wafer 5 can be reliably rotated together with the chuck 2. Thus, step S2, step S3, step S4, and step S5 can be performed in the state in which the chuck 2 holds the semiconductor wafer 5. In this manner, time required for the OCR process can be reduced. Also, the OCR process can be reliably performed. Furthermore, the risk of occurrence of chipping or breakage in the semiconductor wafer can be reduced. Still further, a facility required for the OCR process can be simplified.

<<Subsequent Steps to OCR Process>>

One example of the step of manufacturing the semiconductor device after the OCR process will be explained with reference to FIG. 9 to FIG. 14. Each of FIG. 9 to FIG. 14 is a cross-sectional view of a principal part in the step of manufacturing the semiconductor device according to the present embodiment.

Figure 9:
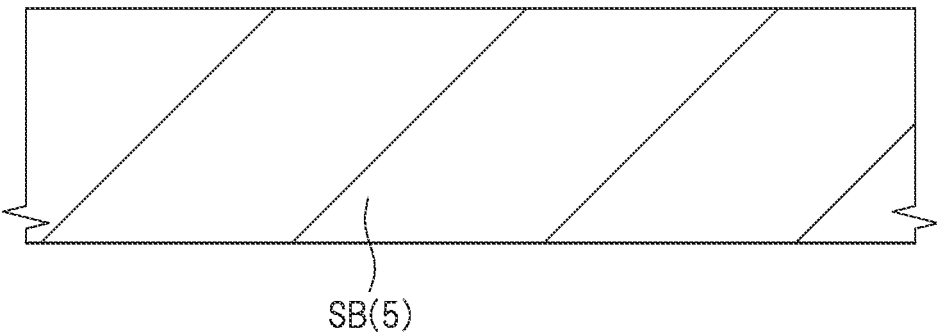
FIG. 9 is a cross-sectional view of a principal part in a step of manufacturing the semiconductor device, continued from the OCR process.

A semiconductor substrate SB shown in FIG. 9 is a semiconductor substrate (semiconductor wafer) formed of p-type single-crystal silicon having a specific resistance on the order of, for example, 1 to 10 Ωcm, and the above-described semiconductor wafer 5 corresponds to the semiconductor substrate SB.

A semiconductor element is formed on the semiconductor substrate SB. In the following, a case of formation of an n-channel-type MISFET (Metal Insulator Semiconductor Field Effect Transistor) as the semiconductor element will be exemplified for explanation.

Figure 10:
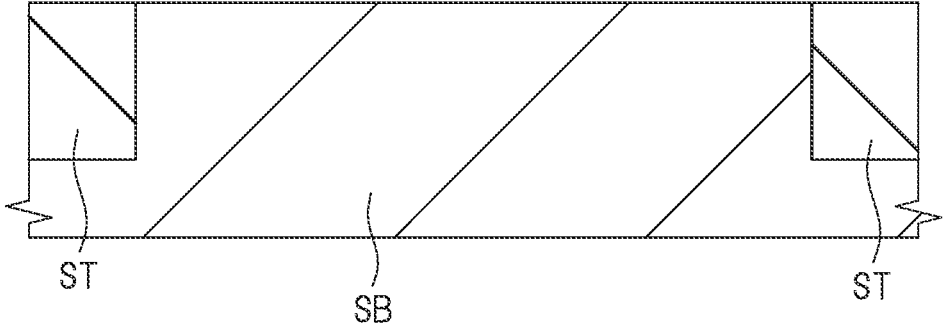
FIG. 10 is a cross-sectional view of a principal part in a step of manufacturing the semiconductor device, continued from FIG. 9.

First, as shown in FIG. 10, an element isolation region ST is formed in the principal surface of the semiconductor substrate SB. The element isolation region ST is made of an insulator such as silicon oxide and can be formed by a STI (Shallow Trench Isolation) method.

Figures 11, 12:
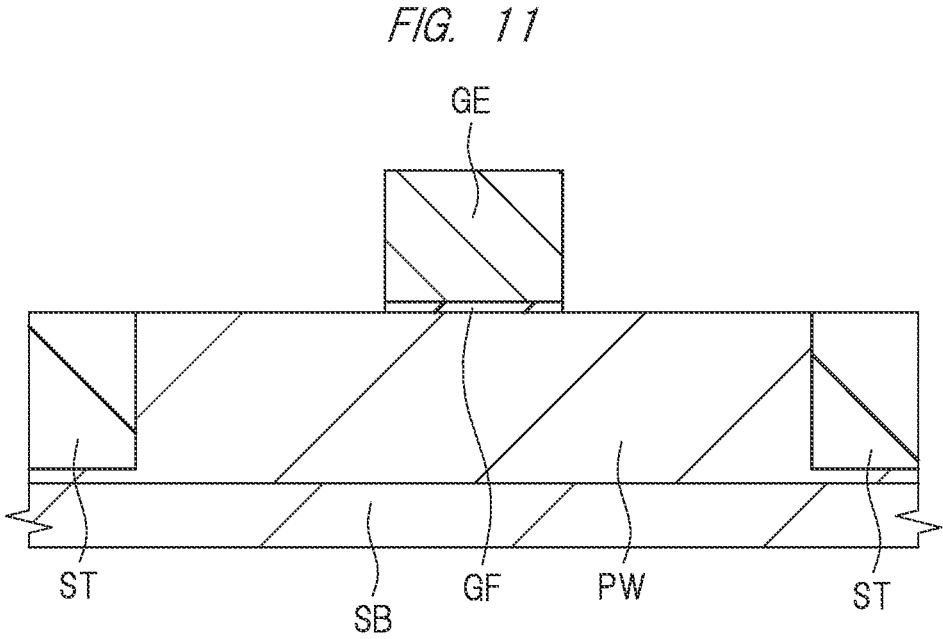
FIG. 11 is a cross-sectional view of a principal part in a step of manufacturing the semiconductor device, continued from FIG. 10.
FIG. 12 is a cross-sectional view of a principal part in a step of manufacturing the semiconductor device, continued from FIG. 11.

Next, as shown in FIG. 11, in a planned area in which the n-channel-type MISFET is to be formed, a p-type well PW is formed in the semiconductor substrate SB by using an ion implantation method or the like.

Next, a gate electrode GE is formed above the semiconductor substrate SB (p-type well PW) so as to arrange a gate insulating film GF therebetween. For example, the gate electrode GE can be formed by forming an insulating film for the gate insulating film GF on the principal surface of the semiconductor substrate SB (a surface of the p-type well PW) by using a thermal oxidation method or the like, forming a conductor film (for example, polysilicon film) for forming the gate electrode GE, and then, patterning this conductor film by using a photolithography method and a dry etching method. The insulating film remaining under the gate electrode GE (insulating film for the gate insulating film GF) becomes the gate insulating film GF.

Next, as shown in FIG. 12, an n⁻-type semiconductor region EX is formed by ion implantation of n-type impurities into regions on both sides of the gate electrode GE in the semiconductor substrate SB (p-type well PW). Then, a side-wall spacer SW is formed on both side walls of the gate electrode GE as a side-wall insulating film. Then, an n⁺-type semiconductor region SD is formed by ion implantation of n-type impurities into regions on both sides of a structure made of the gate electrode GE and the side-wall spacers SW on its side walls. The junction depth of the n⁺-type semiconductor region SD is deeper than the junction depth of the n⁻-type semiconductor region EX, and the impurity concentration of the n⁺-type semiconductor region SD is higher than the impurity concentration of the n⁻-type semiconductor region EX. In this manner, a source/drain region (semiconductor region for the source or drain) of the MISFET is made of the n⁻-type semiconductor region EX and the n⁺-type semiconductor region SD.

Next, activation annealing which is a heat treatment for activating impurities introduced by ion implantation in the above-described steps is performed if needed.

In this manner, the n-channel-type MISFET is formed as the semiconductor element in the semiconductor substrate SB. Also, by reversing the conductivity type, a p-channel-type MISFET can be also formed in the semiconductor substrate SB. Alternatively, both of the n-channel-type MISFET and the p-channel-type MISFET can be also formed in the semiconductor substrate SB. Also, the case of the formation of the horizontal-type MISFET in the semiconductor substrate SB has been explained here. However, a vertical-type MISFET, that is, a trench-gate-type MISFET, can be also formed in the semiconductor substrate SB.

Figure 13:
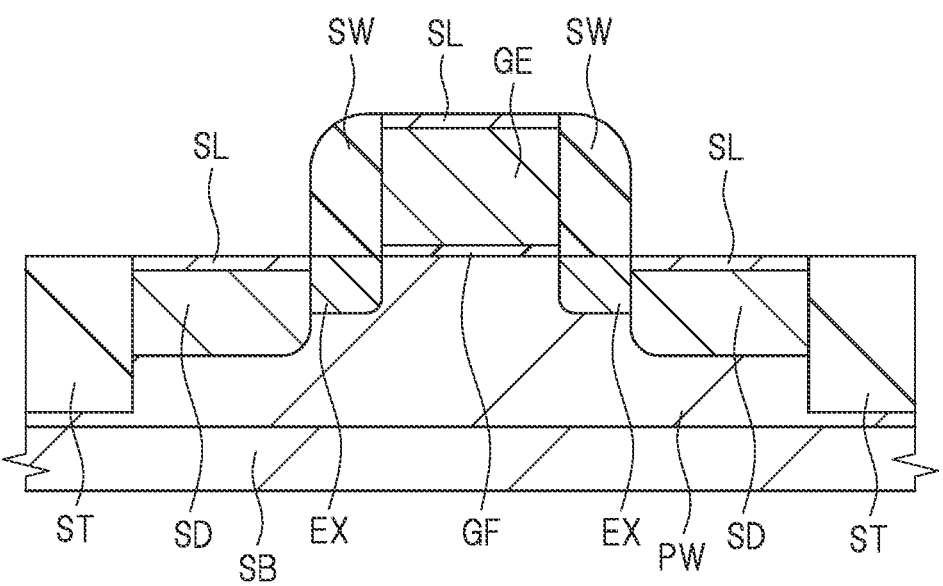
FIG. 13 is a cross-sectional view of a principal part in a step of manufacturing the semiconductor device, continued from FIG. 12.

Next, as shown in FIG. 13, a metal silicide layer SL is formed in a surface of the n⁺-type semiconductor region SD or the upper surface of the gate electrode GE by using silicide technique if needed.

Figure 14:
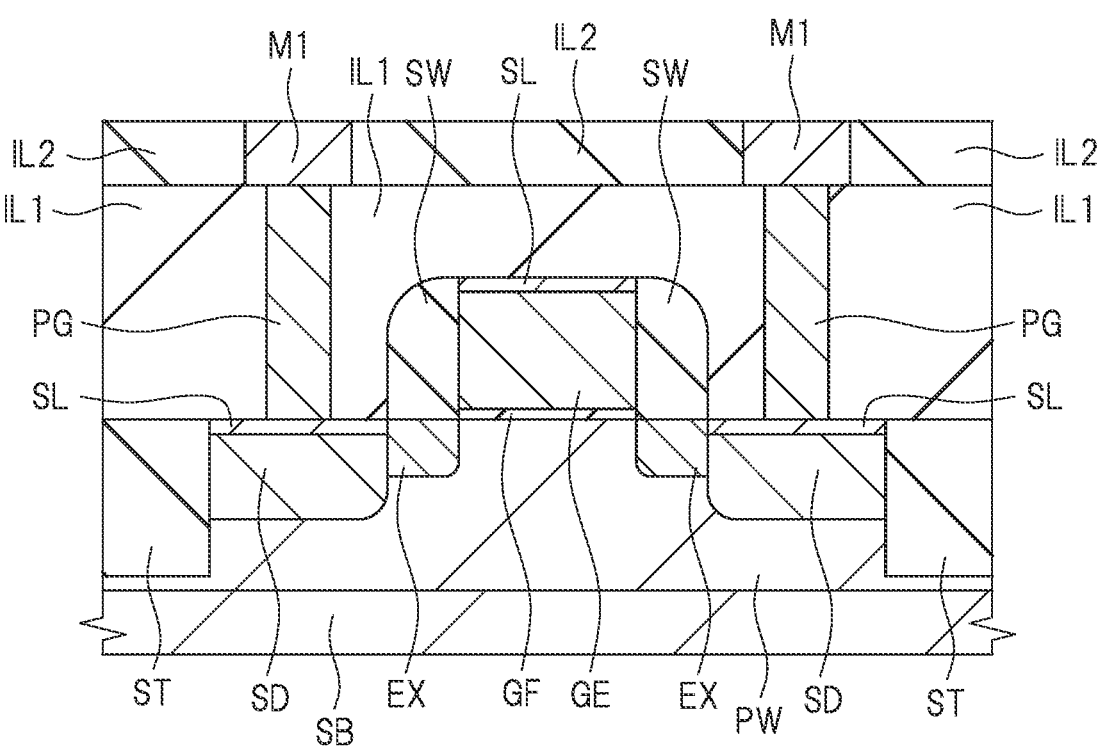
FIG. 14 is a cross-sectional view of a principal part in a step of manufacturing the semiconductor device, continued from FIG. 13.

Next, as shown in FIG. 14, an insulating film IL1 is formed as an interlayer insulating film on the principal surface of the semiconductor substrate SB so as to cover the gate electrode GE, the sidewall spacers SW and the metal silicide layer SL. After formation of the insulating film IL1, flatness of the upper surface of the insulating film IL1 can be also enhanced by, for example, a CMP method of polishing the upper surface of the insulating film IL1 or others.

Next, a contact hole is formed in the insulating film IL1 by using a photolithography technique and an etching technique. Then, a conductive plug PG made of tungsten (W) or the like is formed as a conductor part for connection in the contact hole.

Next, an insulating film IL2 for forming wires is formed on the insulating film IL1 in which the plug PG is buried. Then, a wiring trench is formed in the insulating film IL2 by using a photolithography technique and an etching technique, and a wire M1 is formed in the wiring trench by using a damascene technique. Then, a wire and an insulating film of an upper layer are further formed, but illustration and explanation for these elements are omitted herein.

Then, the semiconductor substrate SB and a structure thereon are diced (cut) into individual pieces, and semiconductor chips are obtained.

MODIFICATION EXAMPLE

Figure 15:
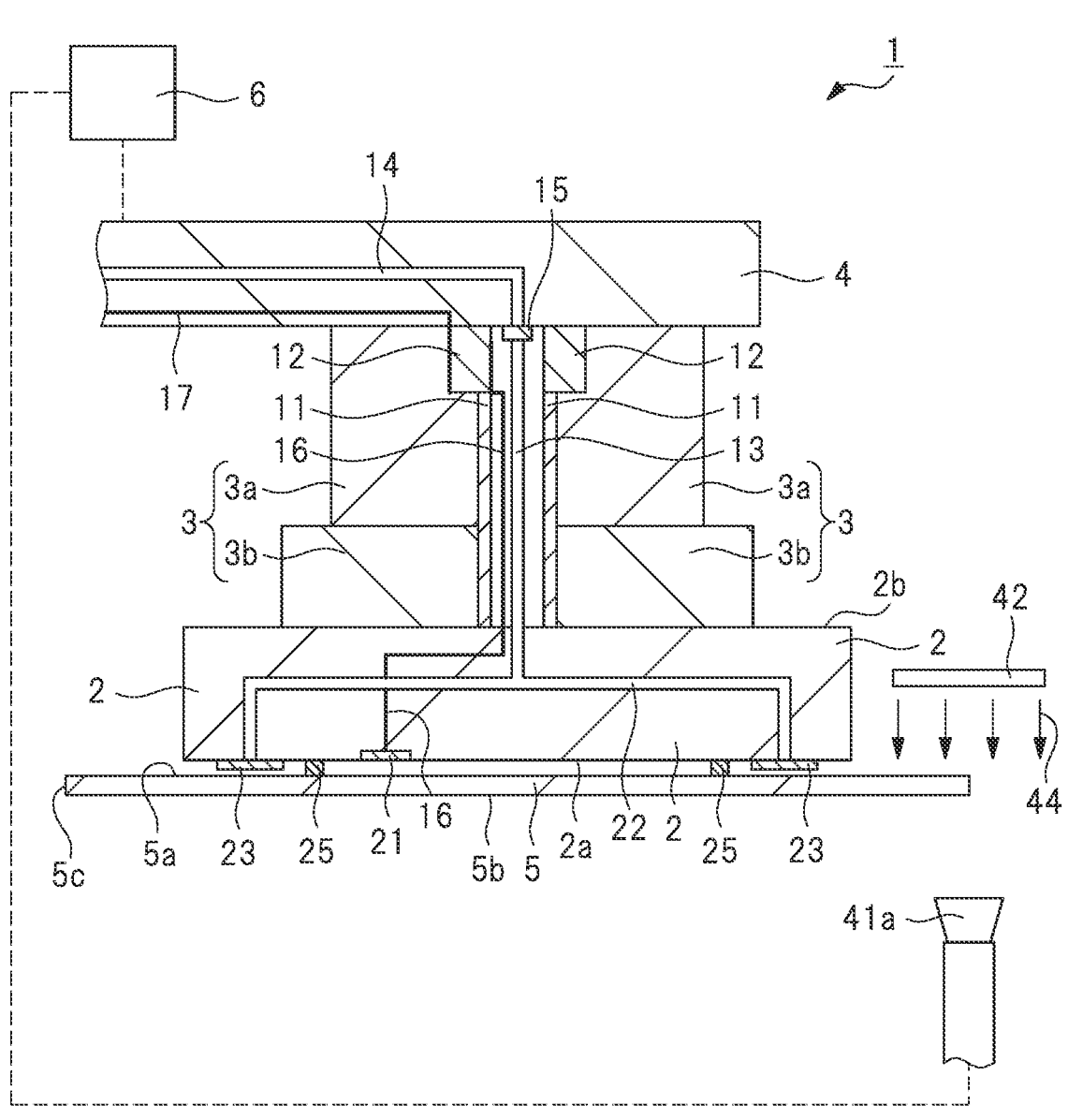
FIG. 15 is a schematic view showing a wafer holding apparatus of a modification example during the OCR process.
Figure 16:
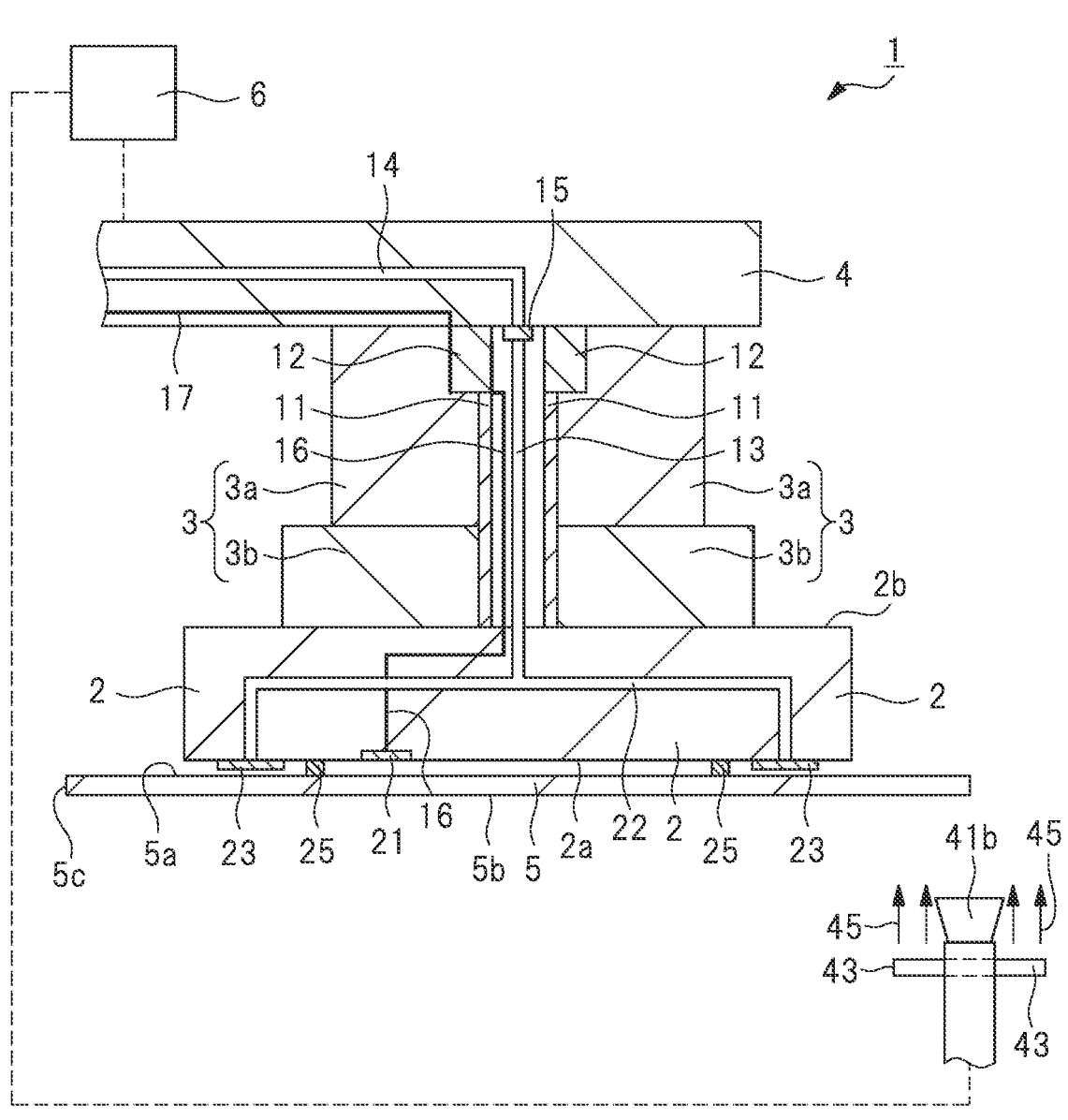
FIG. 16 is a schematic view showing the wafer holding apparatus of the modification example during the OCR process.

Next, a modification example of the character recognition apparatus 1 of the present embodiment will be explained with reference to FIG. 15 and FIG. 16. Each of FIG. 15 and FIG. 16 is a schematic view (cross-sectional view) showing a character recognition apparatus 1 of the modification example during the OCR process, and corresponds to FIG. 6 described above. Note that FIG. 15 shows the character recognition apparatus 1 during the above-described step S2 of the OCR process, and FIG. 16 shows the character recognition apparatus 1 during the above-described step S5 of the OCR process.

In the case of FIG. 6 described above, the above-described step S2 (the detection of the notch 31) and the above-described step S5 (the reading of the information 32) are performed by the same image sensor 41.

On the other hand, in the modification example (FIG. 15 and FIG. 16), the above-described step S2 (the detection of the notch 31) is performed by an image sensor 41*a* shown in FIG. 15, and the above-described step S5 (the reading of the information 32) is performed by an image sensor 41*b* shown in FIG. 16.

Specifically, in the study example (FIG. 15), at the above-described step S2, the semiconductor wafer 5 held by the chuck 2 is rotated together with the chuck 2 when the rotating mechanism 3 rotates the chuck 2, and images of the outline of the rotating semiconductor wafer 5 are sequentially taken by the image sensor 41*a*. Then, when the image sensor 41*a* recognizes (detects) the notch 31 of the semiconductor wafer 5, the rotation of the chuck 2 by the rotating mechanism 3 is stopped, and the rotation of the semiconductor wafer 5 is also stopped. At step S2, while the outer circumferential portion of the principal surface 5*a* of the semiconductor wafer 5 is radiated with the light 44 from the lighting fixture 42, images of the outline of the semiconductor wafer 5 are taken by the image sensor 41*a*.

Also, in the study example (FIG. 16), at the above-described step S5, specifically, while the outer circumferential portion of the principal surface 5*b* of the semiconductor wafer 5 is radiated with the light 45 from the lighting fixture 43, the information 32 provided on the principal surface 5*b* of the semiconductor wafer 5 is read by using the image sensor 41*b*.

In the case of FIG. 6 described above, the above-described step S2 (the detection of the notch 31) and the above-described step S5 (the reading of the information 32) are performed by the single (common) image sensor 41. On the other hand, the study example (FIG. 15 and FIG. 16) needs both of the image sensor 41*a* for performing the above-described step S2 (the detection of the notch 31) and the image sensor 41*b* for performing the above-described step S5 (the reading of the information 32) (that is, two image sensors). Thus, the case of FIG. 6 is advantageous in a point of view of reduction in the number of image sensors to suppress a cost.

In the foregoing, the invention made by the present inventors has been concretely described on the basis of the embodiments. However, it is needless to say that the present invention is not limited to the foregoing embodiments and various modifications can be made within the scope of the present invention.

For example, if it is necessary to rotate the semiconductor wafer held by the wafer holding apparatus in the step of manufacturing the semiconductor device except for the OCR process, the semiconductor wafer can be held and rotated by a wafer holding apparatus to which the technical idea of the above-described character recognition apparatus 1 is applied.

What is claimed is:

1. A semiconductor wafer holding apparatus comprising:
   a Bernoulli chuck having a first surface, a plurality of pads formed on the first surface, and a second surface opposite the first surface; and
   a rotating mechanism for rotating the Bernoulli chuck, the rotating mechanism being arranged on the second surface of the Bernoulli chuck, wherein a plurality of support parts is formed on the first surface of the Bernoulli chuck at positions each deviated from a center of the first surface, wherein, in cross-sectional view, a height of each of the plurality of support parts from the first surface is higher than a height of each of the plurality of pads, wherein, on the first surface of the Bernoulli chuck, each of the plurality of pads is surrounded by any three of the plurality of support parts and an edge of the first surface in a plan view such that one of the three is located between each of the plurality of pads and the center of the first surface and a load-presence sensor is located between another one of the three and the center of the first surface, and wherein, when the Bernoulli chuck holds a semiconductor wafer, the plurality of pads is not in contact with the semiconductor wafer while the plurality of support parts is in contact with a principal surface of the semiconductor wafer;

wherein a first image sensor and a first lighting fixture are provided for reading identification information provided on the principal surface of the semiconductor wafer held by the Bernoulli chuck and the first image sensor and a second lighting fixture are used to detect a notch or an orientation flat of the semiconductor wafer held by the Bernoulli chuck.

2. The semiconductor wafer holding apparatus according to claim 1, wherein, when the rotating mechanism rotates the Bernoulli chuck, the semiconductor wafer held by the Bernoulli chuck also rotates together with the Bernoulli chuck.

3. The semiconductor wafer holding apparatus according to claim 1, wherein the semiconductor wafer is sucked toward the first surface of the Bernoulli chuck by jetting gas from each of the plurality of pads, thereby the semiconductor wafer is in contact with the plurality of support parts.

4. The semiconductor wafer holding apparatus according to claim 1, wherein each of the plurality of support parts is a protruding part formed on the first surface of the Bernoulli chuck.

5. The semiconductor wafer holding apparatus according to claim 1, wherein the first surface of the Bernoulli chuck has a circular shape.

6. The semiconductor wafer holding apparatus according to claim 5, wherein a distance of each of the plurality of support parts from the center of the first surface is equal to or larger than one-third of a radius of the first surface.

7. The semiconductor wafer holding apparatus according to claim 1, wherein the plurality of pads is arranged on a peripheral portion of the first surface of the Bernoulli chuck.

8. The semiconductor wafer holding apparatus according to claim 1, wherein each of the plurality of support parts is made of an elastic body.

9. The semiconductor wafer holding apparatus according to claim 1, wherein each of the plurality of support parts is made of a resin material.

10. The semiconductor wafer holding apparatus according to claim 1, wherein, on the first surface of the Bernoulli chuck, the plurality of support parts is arranged at the positions symmetrical to one another across the center of the first surface.

11. The semiconductor wafer holding apparatus according to claim 10, wherein, on the first surface of the Bernoulli chuck, the plurality of pads is arranged at positions symmetrical to one another across the center of the first surface.

12. The semiconductor wafer holding apparatus according to claim 1, wherein the load-presence sensor is provided on the first surface of the Bernoulli chuck.

* * * * *